United States Patent
Jung et al.

(10) Patent No.: US 8,366,832 B2
(45) Date of Patent: Feb. 5, 2013

(54) DRIVING SHAFT OF EFFUSION CELL FOR DEPOSITION SYSTEM AND DEPOSITION SYSTEM HAVING THE SAME

(75) Inventors: Sung Wha Jung, Suwon (KR); Eu Gene Kang, Suwon (KR)

(73) Assignee: Samsung Displays Co., Ltd., Yongin (KR)

( * ) Notice: Subject to any disclaimer, the term of this patent is extended or adjusted under 35 U.S.C. 154(b) by 1751 days.

(21) Appl. No.: 11/324,346

(22) Filed: Jan. 4, 2006

(65) Prior Publication Data

US 2006/0144325 A1    Jul. 6, 2006

(30) Foreign Application Priority Data

| Jan. 5, 2005 | (KR) | 10-2005-0000946 |
| Jan. 5, 2005 | (KR) | 10-2005-0000949 |
| Jan. 5, 2005 | (KR) | 10-2005-0000957 |

(51) Int. Cl.
  *C23C 16/00* (2006.01)
(52) U.S. Cl. .......... 118/727; 118/726
(58) Field of Classification Search .......... 118/718, 118/727, 726
  See application file for complete search history.

(56) References Cited

U.S. PATENT DOCUMENTS

| 4,954,047 | A | * | 9/1990 | Okuyama et al. | 417/203 |
| 5,301,700 | A | * | 4/1994 | Kamikawa et al. | 134/76 |
| 5,730,801 | A | * | 3/1998 | Tepman et al. | 118/719 |
| 6,294,296 | B1 | | 9/2001 | Weigl | |
| 6,658,083 | B2 | | 12/2003 | Sai | |
| 2002/0098284 | A1 | | 7/2002 | Wheat et al. | |
| 2004/0146415 | A1 | * | 7/2004 | Merrill et al. | 417/414 |
| 2004/0261709 | A1 | | 12/2004 | Sakata | |

FOREIGN PATENT DOCUMENTS

| CN | 100535176 | 9/2009 |
| GB | 682411 | 11/1952 |
| GB | 1151125 | 5/1969 |
| JP | 55-041911 | 3/1980 |
| JP | 62-158861 | 7/1987 |
| JP | 06-155186 | 6/1994 |
| JP | 07-172982 | 7/1995 |
| JP | 2001-015579 | 1/2001 |
| JP | 2001-135989 | 5/2001 |
| JP | 2001-152336 | 6/2001 |
| JP | 2001-313247 | 11/2001 |
| JP | 2002-75855 | 3/2002 |
| JP | 2002-080961 | 3/2002 |
| JP | 2004-006311 | 1/2004 |
| JP | 2004027291 | 1/2004 |
| JP | 2004035964 | 2/2004 |
| JP | 2004269907 | 9/2004 |
| JP | 2004-327272 | 11/2004 |
| JP | 2006-063447 | 3/2006 |
| TW | 315352 | 10/2009 |

OTHER PUBLICATIONS

Chinese Office Action dated Jul. 25, 2008.

* cited by examiner

*Primary Examiner* — Keath Chen
(74) *Attorney, Agent, or Firm* — H.C. Park & Associates, PLC

(57) ABSTRACT

Apparatus for a deposition system includes a sealing apparatus that seals the drive shaft from the deposition material to prevent the deposition material from adhering to the drive shaft, a moving apparatus to reduce the weight of a shelf on the drive shaft, and a collision-preventing apparatus that measures the distance between a shelf and an adjacent article.

8 Claims, 12 Drawing Sheets

DRIVING SHAFT OF EFFUSION CELL FOR DEPOSITION SYSTEM AND DEPOSITION SYSTEM HAVING THE SAME

CROSS-REFERENCE TO RELATED APPLICATIONS

This application claims the benefit of and priority to Korean Patent Application Nos. 2005-00946, 2005-00949 & 2005-00957, filed on Jan. 5, 2005 which are hereby incorporated by reference for all purposes as if fully set forth herein.

BACKGROUND OF THE INVENTION

1. Field of the Invention

The invention relates to a deposition system and associated apparatus and more particularly to a sealing apparatus for a driving shaft of a deposition system, an apparatus to reduce the weight of an effusion cell in a deposition system for ease of movement, and an apparatus to prevent a collision between effusion cells in a deposition system.

2. Description of the Related Art

Electroluminescent displays may be classified as inorganic electroluminescent displays or organic electroluminescent displays depending on the materials used for the luminescent layers. Organic electroluminescent displays are particularly advantageous because they are operable at a low voltage, have a lightweight and thin profile, a wide viewing angle, and a rapid response rate.

Organic electroluminescent devices may include an anode, an organic layer and a cathode formed in a stack on a substrate. The organic layer may include an organic luminescent layer, which emits light. An electron injection layer (EIL) and an electron transport layer (ETL) may be interposed between the cathode and the organic luminescent layer, and a hole injection layer (HIL) and an hole transport layer (HTL) may be interposed between the anode and the organic luminescent layer.

An organic electroluminescent device may be fabricated by a physical vapor deposition method, such as vacuum deposition, or ion plating and sputtering. The organic electroluminescent device may also be fabricated by a chemical vapor deposition using reaction gases.

Vacuum deposition in particular has been used to form the organic layer of an organic electroluminescent device. In a vacuum deposition process, an organic material is vaporized in a vacuum chamber to form an organic vapor material, and the organic vapor material is effused from an effusion cell to be deposited on a substrate.

The size of substrates has increased over time to keep pace with a trend towards large displays. To deposit an organic layer on large substrates, a deposition system has been developed in which an effusion cell in a vacuum chamber effuses an organic vapor material while moving up and down.

This deposition system may include a driving shaft that moves the effusion cell up and down. The driving shaft may be axially rotated by a driving unit. The effusion cell then vaporizes and effuses the organic material while moving up and down.

In conventional deposition systems, the driving shaft may be exposed to the organic vapor material dispersed inside the vacuum chamber. The dispersed organic vapor material may adhere to the driving shaft and prevent the effusion cell from moving smoothly. Accordingly, there is a need for a solution to prevent the dispersed organic vapor material in the vacuum chamber from adhering to the driving shaft.

In deposition systems used for large substrates, a vertical alignment system including a plurality of effusion cells installed on the same line or fixed to a shelf and moved by a moving apparatus may be used so that the organic vapor material effused from the effusion cell may be finely deposited on the substrate. The plurality of effusion cells may be moved by a moving apparatus including a driving source that is configured to allow the shelf and the moving apparatus to communicate.

However, in conventional vertical alignment systems, the driving source may be driven by preset data, and it is therefore difficult to confirm the position of a shelf that has been stopped and then moved again, such as when a shelf is stopped and then moved in the reverse direction. This may increase the danger of a collision between shelves or between shelves and other apparatus. Operator error, such as inputting bad data or causing the driving source to operate outside its normal range, may also increase the danger of a collision which may damage the effusion cells.

Therefore, there exists a need for a solution to prevent a shelves of a deposition system from colliding with another shelf or other apparatus.

A vertical alignment system in which a substrate and a mask are aligned in a standing state may be used to eliminate a warpage phenomenon of large substrates on which an effused material is deposited. Accordingly, there exists a need for a moving apparatus to precisely move effusion cells included in the vertical alignment system.

SUMMARY OF THE INVENTION

The present invention provides an apparatus for sealing a driving shaft of an effusion cell for a deposition system to prevent organic vapor material effused from the effusion cell from being adhered to the driving shaft.

The present invention also provides an apparatus for preventing a collision of an effusion cell in a deposition system by measuring a distance between adjacent shelves in operation. The apparatus may include a control part for comparing newly inputted data with preset data to control the operation of a driving part and prevent collisions.

The present invention also provides an apparatus for moving an effusion cell. The apparatus may include a driving shaft and a pulley system to decrease the overall weight of the effusion cell to enable precise movement of the shelf and prevent the shelf from falling.

Additional features of the invention will be set forth in the description which follows, and in part will be apparent from the description, or may be learned by practice of the invention.

The present invention discloses a sealing apparatus for a driving shaft of a deposition system including a shelf that includes a coupling part coupled with a driving shaft installed in a vacuum chamber of a deposition system, a connection part including a slot, the connection part connected to the coupling part, and a support plate connected to the connection part, the support plate supporting an effusion cell effusing an organic vapor material in the vacuum chamber; a hollow beam partially enclosing the driving shaft, the beam comprising one open side such that the support body may be moved along the driving shaft; and a shielding plate arranged through the slot.

The present invention also discloses a sealing apparatus for a driving shaft of a deposition system including a shelf that includes a coupling part coupled with a driving shaft installed in a vacuum chamber of a deposition system, and a support plate connected to the coupling part, the support plate supporting an effusion cell effusing an organic vapor material in the vacuum chamber; a first tube encircling the driving shaft, the first tube arranged above the coupling part; and a second tube encircling the driving shaft, the second tube arranged below the coupling part.

The present invention also discloses a deposition system including a vacuum chamber; a stage comprising a chuck supporting a substrate aligned with a mask arranged at one side of the vacuum chamber; a driving shaft arranged at the other side of the vacuum chamber; a shelf comprising a coupling part coupled with the driving shaft, a connection part comprising a slot, the connection part connected to the coupling part, and a support plate connected to the connection part; an effusion cell arranged on the support plate, the effusion cell effusing an organic vapor material toward the substrate; a hollow beam partially enclosing the driving shaft, the beam comprising one open side such that the support body may be moved along the driving shaft; and a shielding plate arranged through the slot.

The present invention also discloses a deposition system including a vacuum chamber; a stage comprising a chuck supporting a substrate aligned with a mask arranged at one side of the vacuum chamber; a driving shaft arranged at the other side of the vacuum chamber; a shelf including a coupling part coupled with the driving shaft, and a support plate connected to the coupling part; an effusion cell arranged on the support plate, the effusion cell effusing an organic vapor material toward the substrate; a first tube encircling the driving shaft, the first tube arranged above the coupling part; and a second tube encircling the driving shaft, the second tube arranged below the coupling part.

The present invention also discloses a moving apparatus for an effusion cell including a shelf; an effusion apparatus fixedly arranged on the shelf; a driving shaft coupled with the shelf in such a way that the shelf is moved up or down by the rotation of the driving shaft; a weight; and a connector, the connector having one end coupled with the shelf and the other end coupled with the weight.

The present invention also discloses a collision-preventing apparatus for an effusion cell including a driving part that includes a driving source, a driving shaft driven by the driving source, at least one shelf coupled to the driving shaft in such as way that the at least one shelf is moved up or down by the rotation of the driving shaft, and an effusion apparatus fixed on the shelf; a detection part comprising, a sensor measuring a distance from an adjacent article; and a control part comparing data collected from the sensor of the detection part with preset data to control the operation of the driving part.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
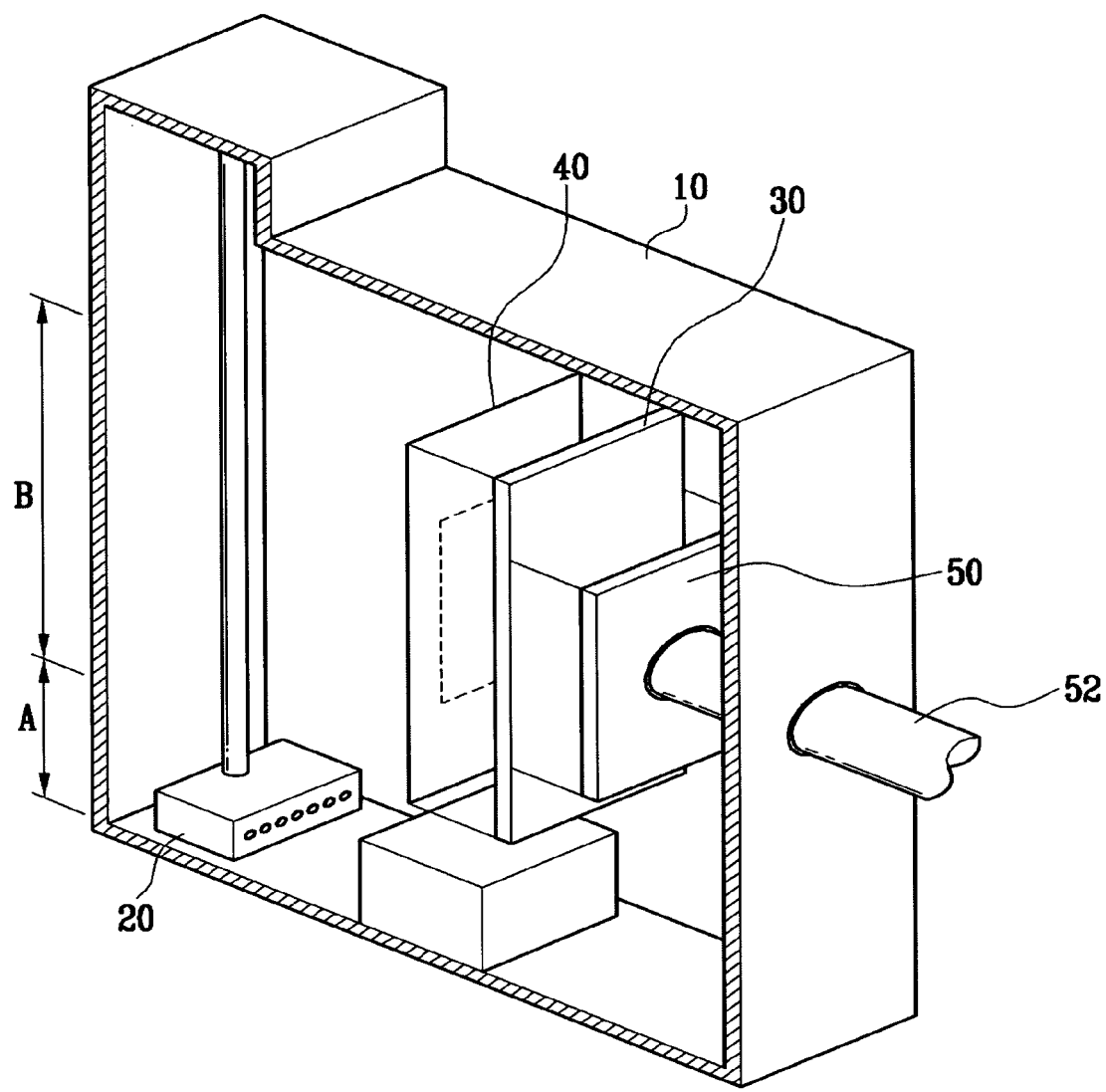
FIG. 1 is a schematic perspective view of a vacuum deposition system according to an exemplary embodiment of the present invention in which an effusion cell is disposed at a buffer region.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity.

It will be understood that when an element such as a layer, film, region or substrate is referred to as being "on" another element, it can be directly on the other element or intervening elements may also be present. In contrast, when an element is referred to as being "directly on" another element, there are no intervening elements present.

Figure 2:
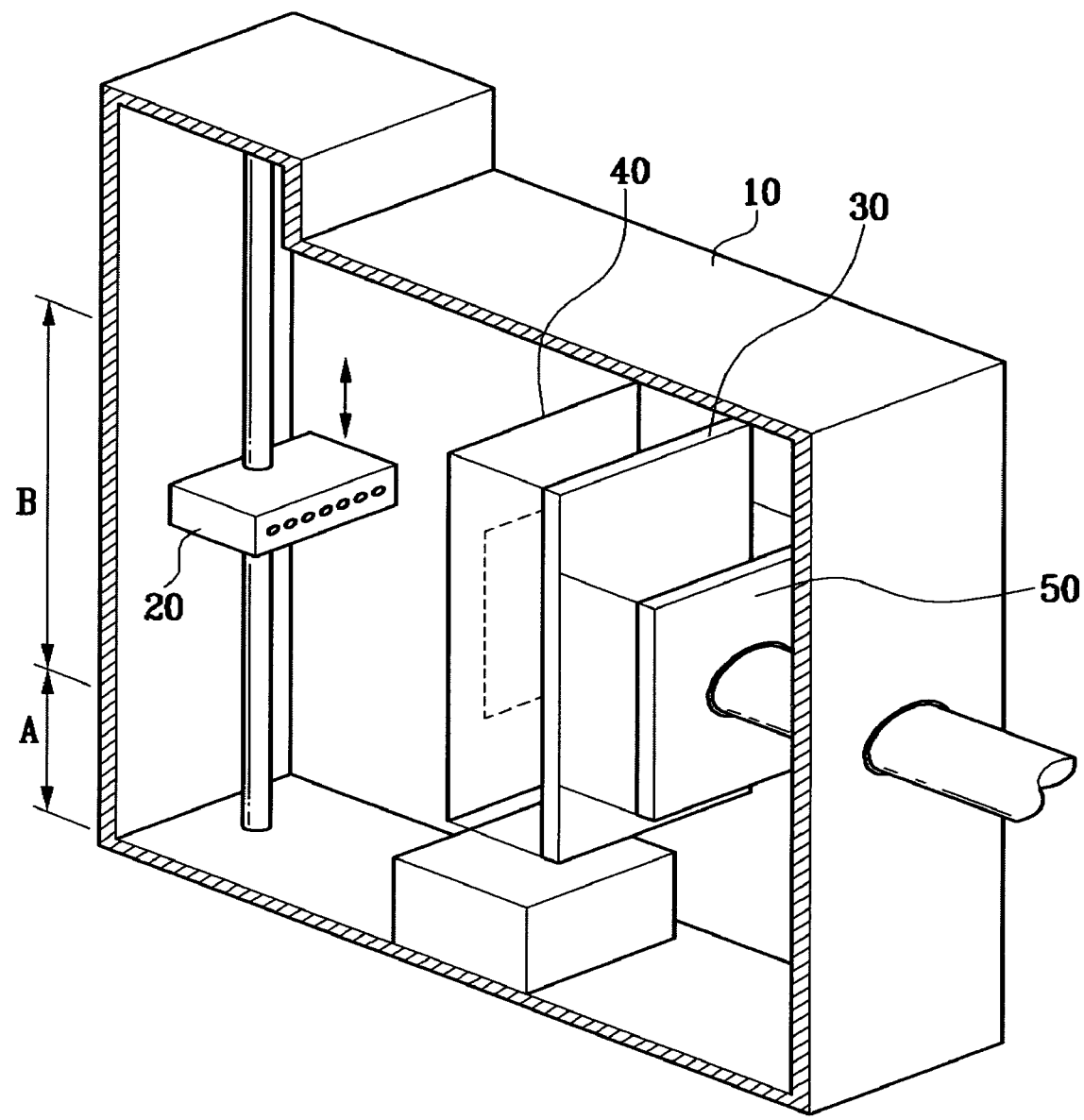
FIG. 2 is a schematic perspective view of a vacuum deposition system according to an exemplary embodiment of the present invention in which an effusion cell is disposed at a film formation region.

FIG. 1 is a schematic perspective view of a vacuum deposition system according to an exemplary embodiment of the present invention in which an effusion cell is disposed in a buffer region. FIG. 2 is a schematic perspective view of a vacuum deposition system according to an exemplary embodiment of the present invention in which an effusion cell is disposed in a film formation region.

Referring to FIG. 1, A vacuum chamber 10 of a vacuum deposition system may contain a substrate 30 on which an organic layer may be formed, a mask 40 arranged in front of the substrate 30, and an effusion cell 20 arranged at a predetermined distance from the mask 40. The mask 40 and the substrate 30 may be arranged close to each other and fixed to a chuck 50 by an alignment system (not shown). The chuck 50 is connected with a stage (not shown) through a connecting tube 52. The alignment system is mounted on the stage.

The mask 40 may include a pattern formation part (indicated by a dotted line) that has a pattern corresponding to the pattern of an organic layer to be formed. A fixing part may be fixed to a mask frame (not shown). The vacuum chamber 10 may be divided into a film formation region B in which the mask 40 and the substrate 30 are installed, and a buffer region A.

The effusion cell 20 may be attached to and moved by a shaft that is axially rotated by a moving means (not shown). The effusion cell 20 may be moved up or down in a vertical direction inside the vacuum chamber 10 by changing the rotational direction of the driving shaft.

Figure 3:
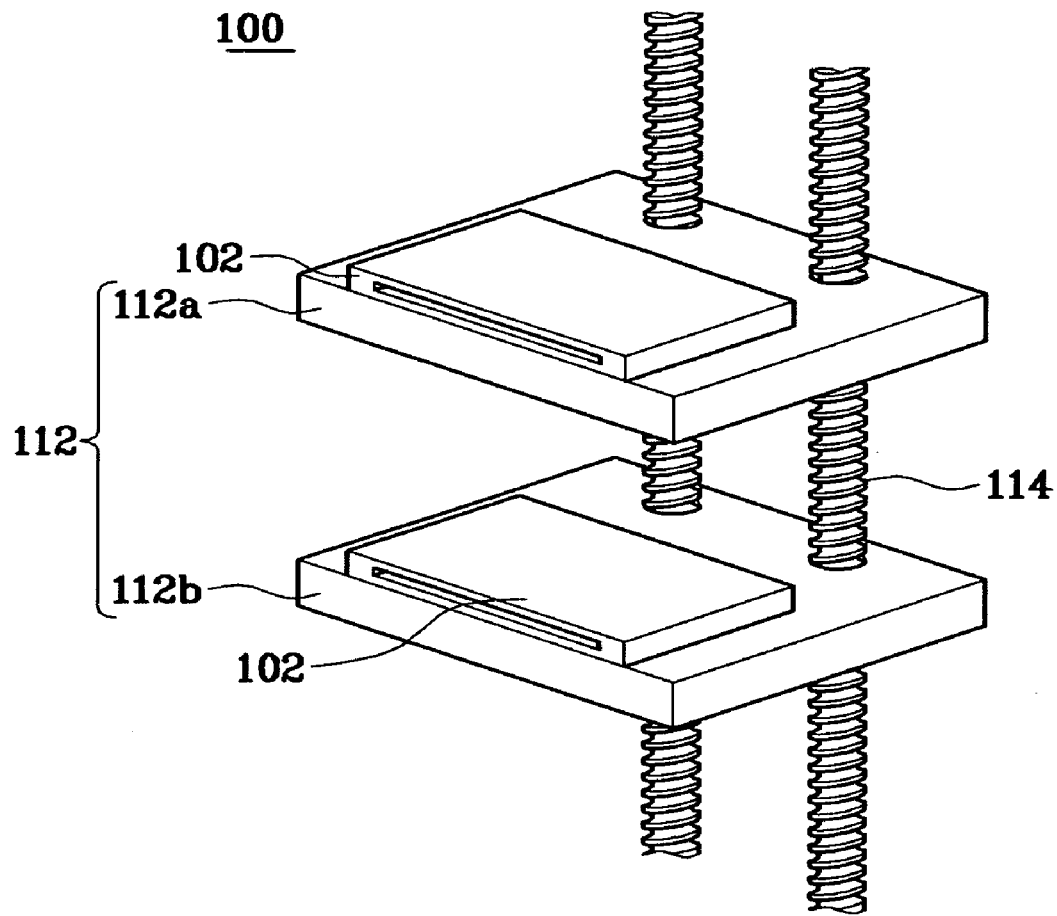
FIG. 3 is a schematic perspective view of a collision-preventing apparatus according to an exemplary embodiment of the present invention.
Figure 4:
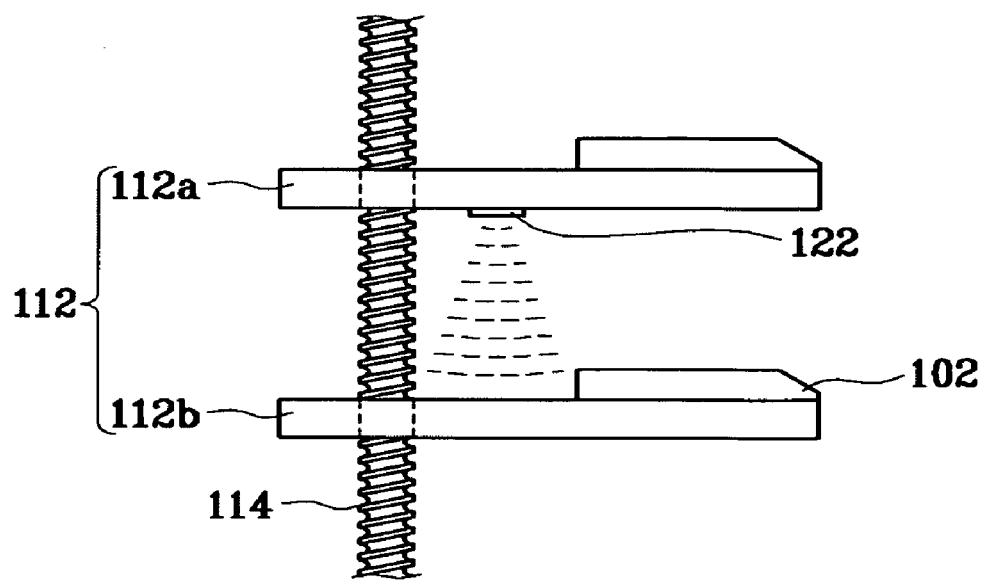
FIG. 4 is a side view of the collision-preventing apparatus shown in FIG. 3.
Figure 5A:
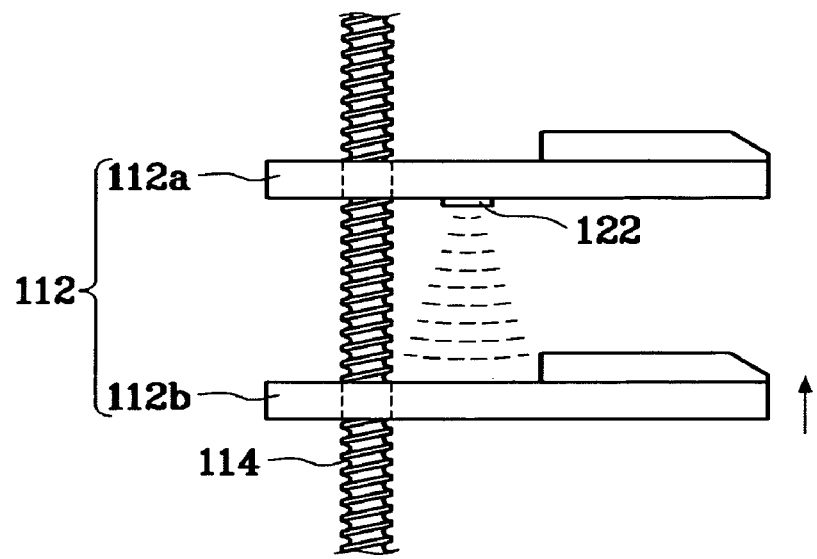
FIG. 5A and FIG. 5B are schematic views illustrating the operation of the collision-preventing apparatus of FIG. 3.
Figure 5B:
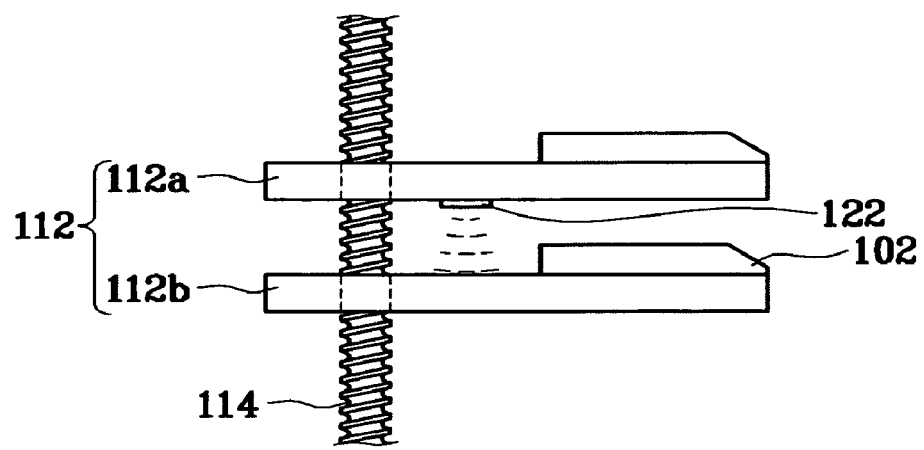
Figure 6:
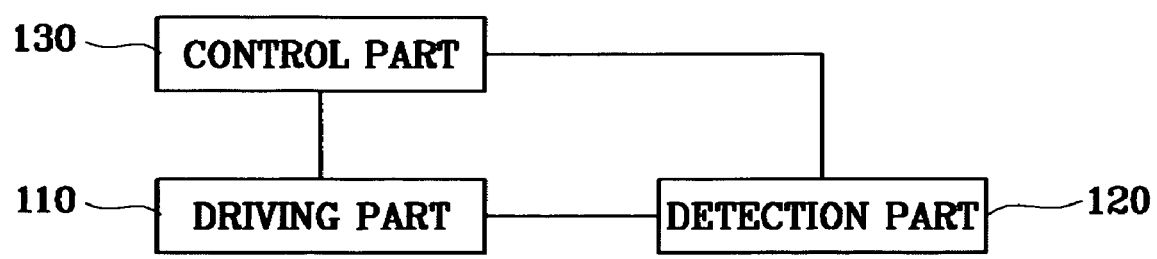
FIG. 6 is a block diagram showing elements of the collision-preventing apparatus shown in FIG. 3.

FIG. 3 and FIG. 4 are a schematic perspective view and a side view, respectively, of a collision-preventing apparatus for an effusion cell according to an exemplary embodiment of the present invention. FIG. 5A and FIG. 5B are schematic views illustrating the operation of the collision-preventing apparatus of FIG. 3. FIG. 6 is a block diagram showing elements of the collision-preventing apparatus according to an exemplary embodiment of the present invention.

Referring to FIG. 3, FIG. 4, FIG. 5A, FIG. 5B, and FIG. 6, the collision-preventing apparatus may include a driving part 110 configured to move at least one shelf 112 up and down, a detection part 120 for detecting the distance between adjacent shelves 112a and 112b using a sensor 122, and a control part 130 for comparing data received from the detection part 120 with preset data to control the operation of the driving part 110.

The driving part 110 may include a driving shaft 114 arranged substantially vertically and driven by a driving source, such as a motor. The driving part 110 may also include at least one shelf 112 configured to move up and down along the driving shaft 114 in a reciprocating pattern, and an effusion cell 102 fixed on each of the shelves 112.

As shown in FIGS. 5A and 5B, the detection part 120 may include a distance measurement sensor 122 installed in the shelf 112 or the effusion cell 102 to continuously measure the distance from the shelf 112 to an adjacent article positioned in the path of the shelf 112. The detection part 120 may continuously transmit distance data measured by the sensor 122 to the control part 130.

The distance measurement sensor 122 may be arranged at the bottom side of the shelf 112 to detect a lower shelf 112 or other obstacle or may be arranged at the top side of the shelf 112 to detect an upper shelf 112 or other obstacle.

The distance measurement sensor 122 may be used to detect other shelves 112, other effusion cells 102, or other obstacles, such as a stopper for restricting the moving range of the shelf 112 or a jaw for preventing the shelf 112 from separating.

The distance measurement sensor 122 may be a non-contact sensor, such as an ultra sonic sensor, a light sensor, an optical fiber sensor, an infrared ray sensor, or an ultra violet sensor.

The control part 130 receives distance data measured by the detection part 120, and compares and analyzes the received distance data with preset data to stop the operation of the driving part 110 in an emergency or change the traveling direction of the shelf 112.

The preset data may include data related to a safety distance to be maintained between a shelf 112a and an adjacent shelf 112b or another adjacent article depending on the traveling direction of the shelf 112a.

The operation of the collision-preventing apparatus according to an exemplary embodiment of the present invention will now be described in brief.

The driving part 110 is driven automatically and moves at least one shelf 112 on which an effusion cell 102 is arranged. Data on the moving range of the shelf 112a and data on the required safety distance from another shelf 112b or another article are input to the control part 130.

If the shelf 112a approaches close to an adjacent shelf 112b or another article, the sensor 122 measures the distance between the adjacent shelves 112 or between the shelf 112a and the article and transmits the measured distance to the control part 130. The control part 130 receives the distance data transmitted from the sensor 122 and compares the received distance data with preset distance data to control the driving part 110 to stop or change the direction of the shelf 112a.

The distance of the shelf 112a to an adjacent article may be continuously detected by the detection part 120 and monitored by the control part 130 to continuously effect fine readjustment of the movement of the shelf 112a using the detected data.

A moving apparatus for an effusion cell according to an exemplary embodiment of the present invention will now be described.

Figure 7:
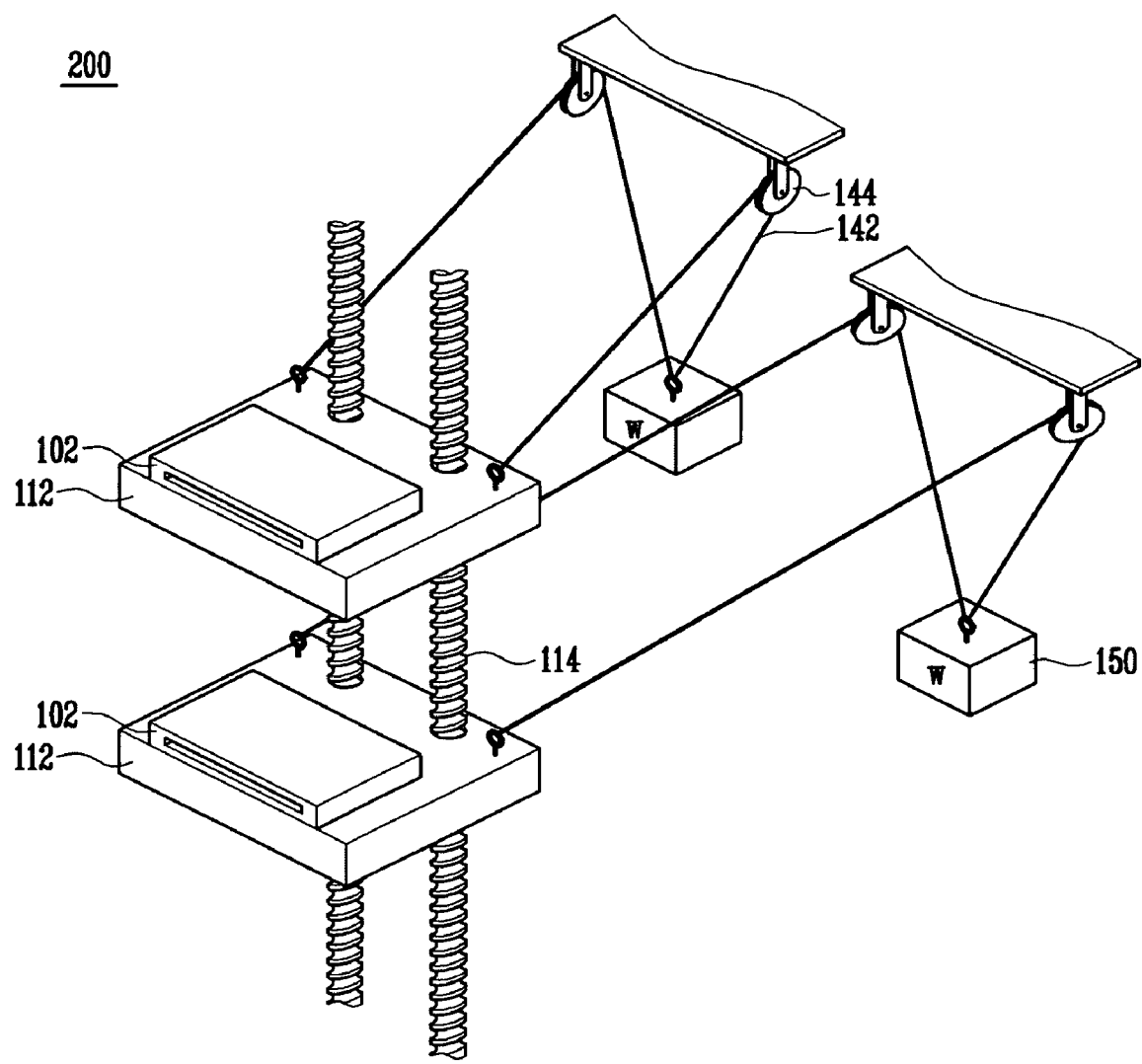
FIG. 7 is a schematic perspective view of a moving apparatus for an effusion cell according to an exemplary embodiment of the present invention.
Figure 8:
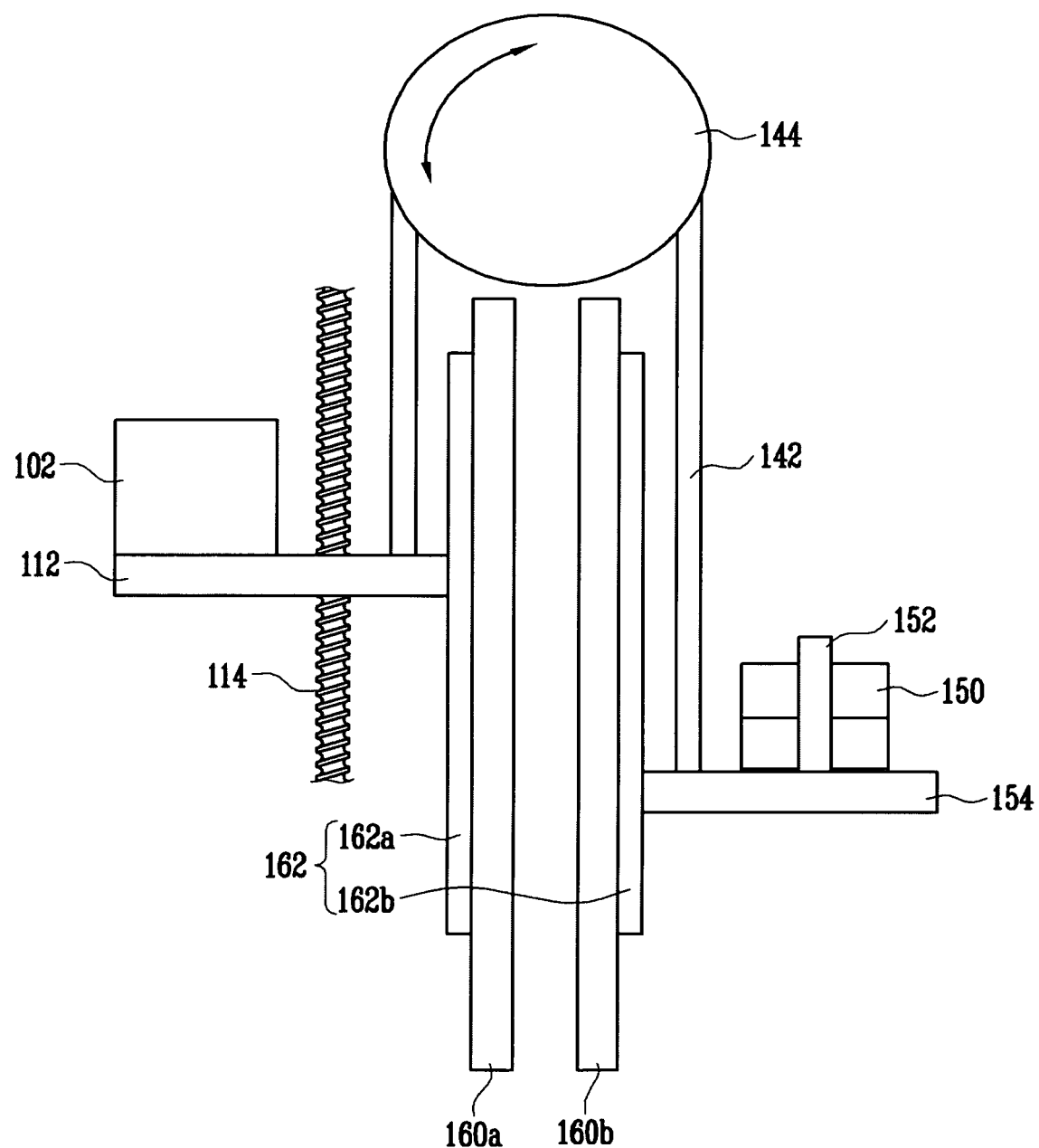
FIG. 8 is a schematic side view of the moving apparatus shown in FIG. 7.

FIG. 7 is a schematic perspective view of a moving apparatus for an effusion cell according to an exemplary embodiment of the present invention. FIG. 8 is a schematic side view of the moving apparatus shown in FIG. 7.

Referring to FIG. 7 and FIG. 8, the moving apparatus 200 may be employed in a vertical alignment system. The moving apparatus 200 may include an effusion cell 102 arranged on a shelf 112, a connector 142 wrapped around a pulley 144 and connected to one edge of the shelf 112, and a weight 150 connected to the other end of the connector 142. The effusion cell 102 is provided to deposit an organic material on a standing substrate and is firmly fixed to the shelf 112. The moving apparatus 200 may include one or more effusion cells 102.

The shelf 112 may be coupled with at least one driving shaft 114, which moves the shelf up and down. It is preferable that only one effusion cell 102 be fixed to each shelf 112, however, it is possible to fix more than one effusion cell 102 to each shelf 112.

The one or more driving shafts 114 are rotated by a separate driving apparatus and may be coupled with one or more shelves 112. The shelves 112 ascend and descend by the operation of the driving shafts 114.

The pulleys 144 may be connected to a ceiling, a sidewall, or a separate prop so that they can rotate with the movement of the connectors 142. The shelves 112 and the weights 150 may be coupled with the connectors 142 by an eyebolt. The connectors 142 may be a belt, a wire, a chain, a rope, or the like. The pulleys 144 may be replaced or modified to accommodate the particular type of connector selected.

The weight of the shelves 112 on the driving shafts 114 is decreased by the weight of the weights 150 because the shelves 112 are connected to the weights 150 by the connectors. The weight of the weights 150 may be about equal to the weight of the shelf 112 or the total weight of the shelf 112 and the effusion cell 102. When the weight of the shelf 112 is about equal to the weight of the weights 150, the weight of the shelf 112 placed on the driving shafts 114 is reduced to about zero. This will help prevent the shelf 112 from falling freely in the event of an accident.

Referring to FIG. 8, a first guide plate 162a may be fixed to a first support frame 160a, which may be fixedly arranged in a vacuum chamber 10 of a vacuum deposition system. A shelf 112 with an effusion cell 102 arranged on it may be arranged so as to move along the first guide plate 162a. A second guide plate 162b may be fixed to a second support frame 160b, which is fixedly arranged in the vacuum chamber 10 of the vacuum deposition system. A surface plate 154 on which weights 150 may be mounted may be connected with the shelf 112 by a connector 142. The weights 150 may be fixed to the surface plate 154 by a fixing member 152. The connector 142 may be wound around a pulley 144. The pulley 144 may be fixed to a ceiling (not shown) or the support frame so that it may freely rotate.

The method of operation of the moving apparatus for an effusion cell will now be described in brief.

One end of the connector 142 may be connected to a front edge of the shelf 112 on which the effusion cell 102 is arranged and the other end of the connector 142 may be connected to one or more weights 150. The connector 142 may be wound around the pulley 144. The shelf 112 on which the effusion cell 102 is fixed and the surface plate 154 on which the weights 150 are fixed may be guided along their respective guide plates 162a and 162b.

The weights 150 decrease the weight of the shelf 112 on the driving shaft 114. The weight of the weights 150 may be made approximately equal to the weight of the shelf 112 on which the effusion cell is fixed to prevent the shelf 112 from falling freely due to an accident. Furthermore, the driving apparatus can move the shelf using a smaller driving force because the weight of the shelf 112 on the driving shaft 114 is decreased.

An apparatus for sealing a drive shaft of a deposition system according to an exemplary embodiment of the present invention will now be described.

Figure 9:
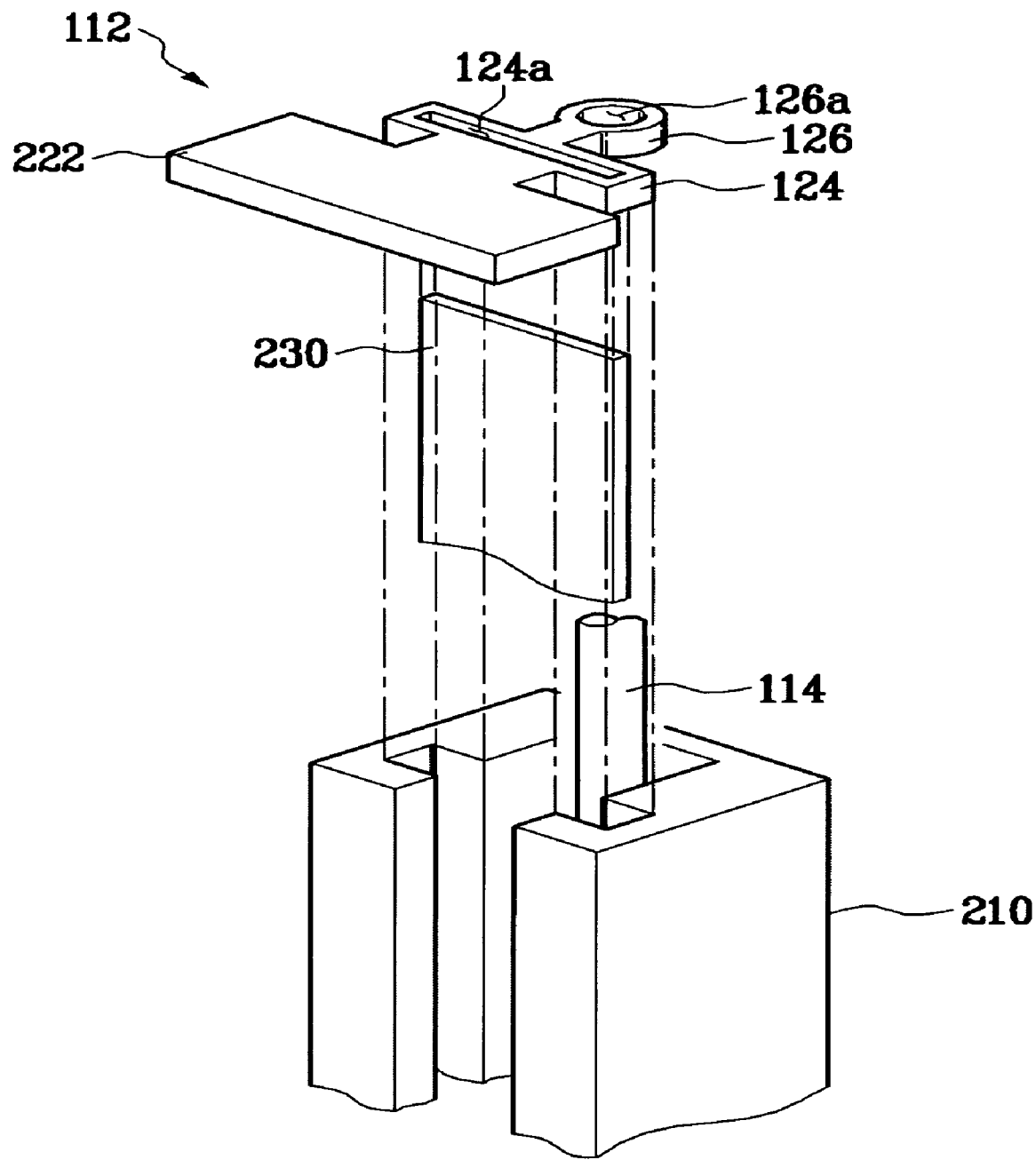
FIG. 9 is a disassembled perspective view illustrating a sealing apparatus installed around a driving shaft according to an exemplary embodiment of the present invention.
Figure 10:
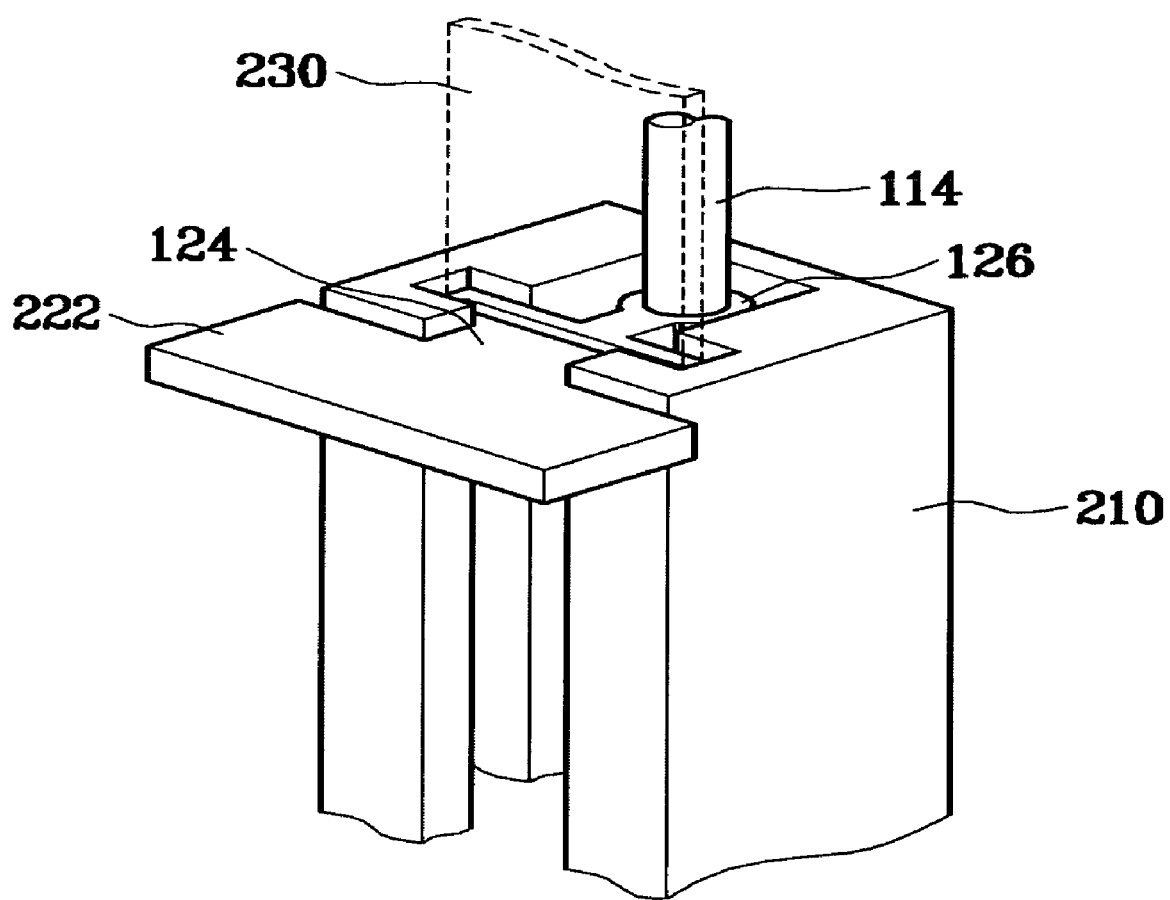
FIG. 10 is an assembled perspective view of a sealing apparatus according to an exemplary embodiment of the present invention.

Referring to FIG. 9 and FIG. 10, an apparatus for sealing a driving shaft for an effusion cell in a deposition system includes a beam 210 enclosing a driving shaft 114. The beam 210 has an inner space that can accommodate a coupling part 126 and a connection part 124 of a shelf 112. The beam 210 has an open portion at one side to allow the shelf 112 to move up and down.

The shelf 112 may include a coupling part 126 coupled with the driving shaft 114, a support plate 222 on which the effusion cell 102 may be mounted, and a connection part 124 connecting the coupling part 126 with the support plate 222. The coupling part has a slot 124a. A shielding plate 230 (represented by dashed lines) may be inserted through the slot 124a. The driving shaft 114 may be inserted through the hole 126a in the coupling part 126. The driving shaft 114 may be coupled to the hole 126a by gears which move the coupling part 126 and the shelf 112 up and down when the driving shaft 114 is rotated by a driving means (not shown).

The coupling part 126, the connection part 124 of the shelf 112, and the driving shaft 114 are arranged in the inner space of the beam 210. The inner surfaces of the beam 210 define a groove that accommodates the shielding plate 230 and the portion of the connection part 124 that includes the slot 124a. The groove extends to the outside of the beam 210 and is arranged in a vertical direction. The shelf 112 has a groove formed between the coupling part 126 and the support plate 222 to accommodate the walls of the beam at the open side of the beam 210. The walls of the beam 210 at the open side of the beam 210 serve as a wing part inserted into the groove of the shelf 112.

As shown in FIG. 10, the driving shaft 114 is inserted into the hole 126a of the coupling part 126, the wing part of the beam 210 is inserted into the groove of the shelf 112, the portion of the connection part 124 that includes the slot 124a is inserted into the groove of the beam 210, and the coupling part 126 and the connection part 124 of the shelf 112 are inserted into the inner space of the beam 210. The shielding plate 230 is inserted into the slot 124a of the connection part 124 to seal the driving shaft from the rest of the deposition system.

Figure 11:
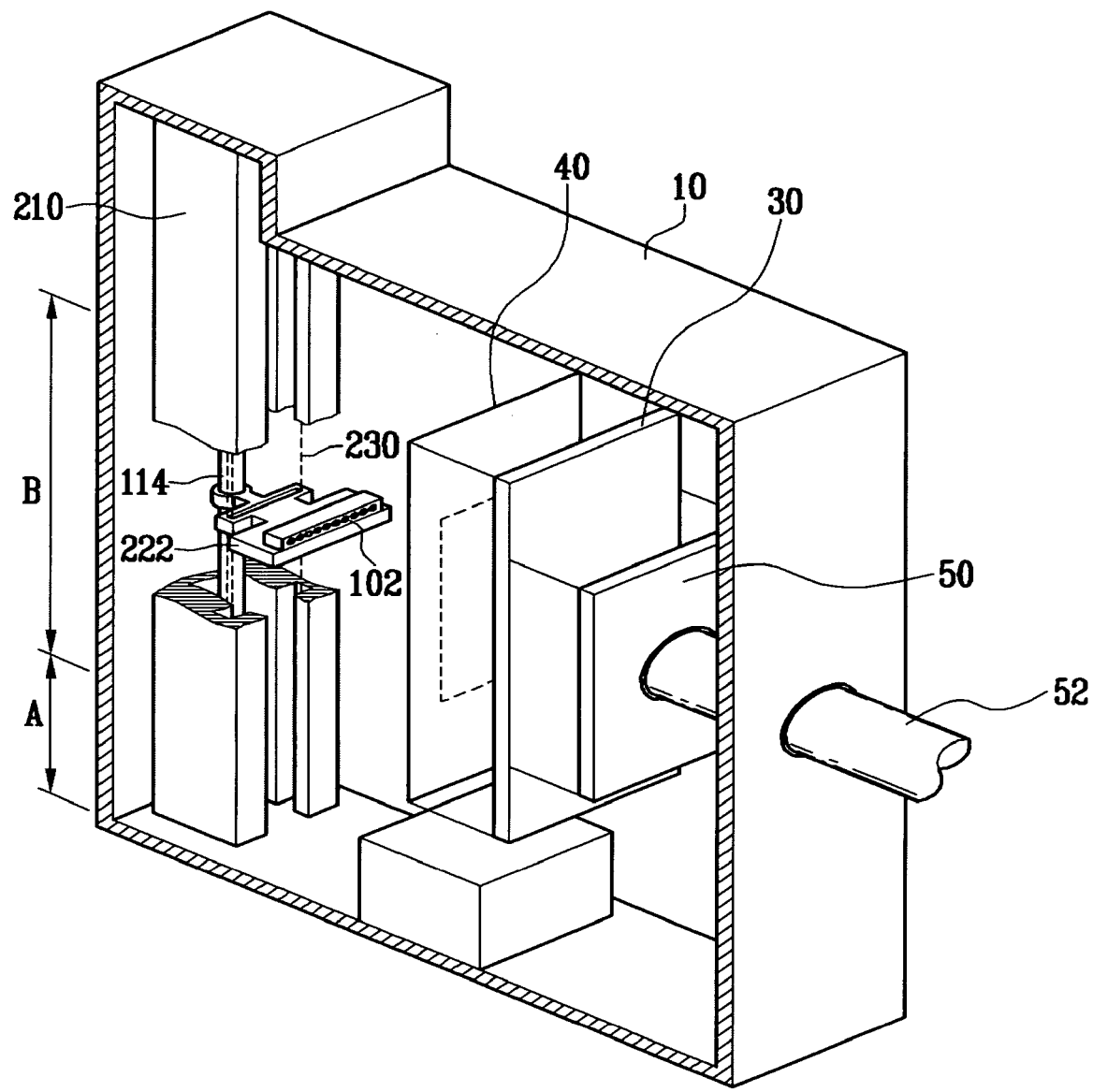
FIG. 11 is a perspective view of a deposition system in which a sealing apparatus according to an exemplary embodiment of the present invention is installed in a vacuum chamber.

FIG. 11 shows a deposition system in which the sealing apparatus of the driving shaft according to an exemplary embodiment of the present invention is installed. A chuck 50 for supporting a substrate 30 aligned with a mask 40 may be provided at one side of a vacuum chamber 10. The chuck 50 is connected with a stage (not shown) through a connecting tube 52. A driving shaft 114 may be arranged in an inner space of a beam 210 at the other side of the vacuum chamber 10. A shielding plate 230 seals the driving shaft 114 from the rest of the vacuum chamber 10. An effusion apparatus 102 may be mounted on the support plate 222 of the shelf 112. The support plate 222 of the shelf 112 may be exposed to the atmosphere of the vacuum chamber 10 through an open side of the beam 210. The driving shaft 114 may be axially rotated by a driving means (not shown) to drive the support plate 222 of the shelf 112 up and down along the open side of the beam 210. An organic vapor material effused from the effusion apparatus 102 in the vacuum chamber 10 may thus be prevented from adhering to the driving shaft 114.

Figure 12:
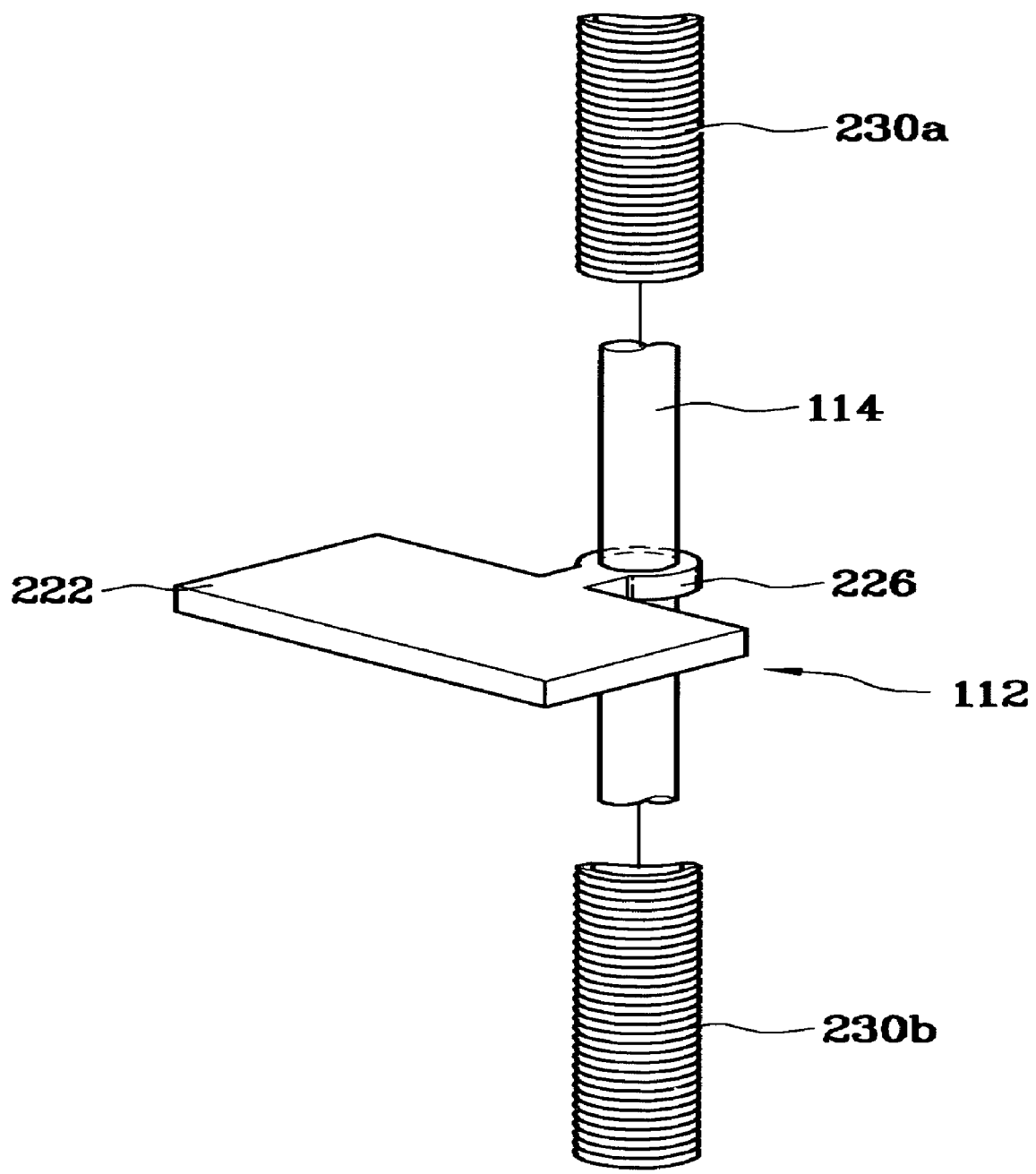
FIG. 12 is a disassembled perspective view illustrating a sealing apparatus according to an exemplary embodiment of the present invention installed around a driving shaft.

FIG. 12 shows an apparatus for sealing a driving shaft for an effusion cell in a deposition system according to another exemplary embodiment of the present invention. The sealing apparatus may include a shelf that includes a coupling part 226 coupled with a driving shaft 114 and a support 222 on which an effusion cell may be mounted. An upper portion of the driving shaft 114 positioned above the coupling part 226 may be encircled by a first tube 230a and a lower portion of the driving shaft 114 positioned below the coupling part 226 may be encircled by a second tube 230b.

The lower end of the first tube 230a may be fixed to an upper surface of the coupling part 226 and an upper end of the second tube 230b may be fixed to a lower surface of the coupling part 226. An upper end of the first tube 230a may be fixed to an upper surface of the vacuum chamber 10 and a lower end of the second tube 230b may be fixed to a lower surface of the vacuum chamber 10. The driving shaft 114 is thus kept sealed by the first and second tubes 230a and 230b and the coupling part 226.

The first tube 230a and the second tube 230b may have a structure that allows them to expand and compress to maintain a seal around the driving shaft as the coupling part 226 is moved up and down by the driving shaft 114. For example, the first tube 230a and the second tube 230b may have a bellows type structure.

Figure 13A:
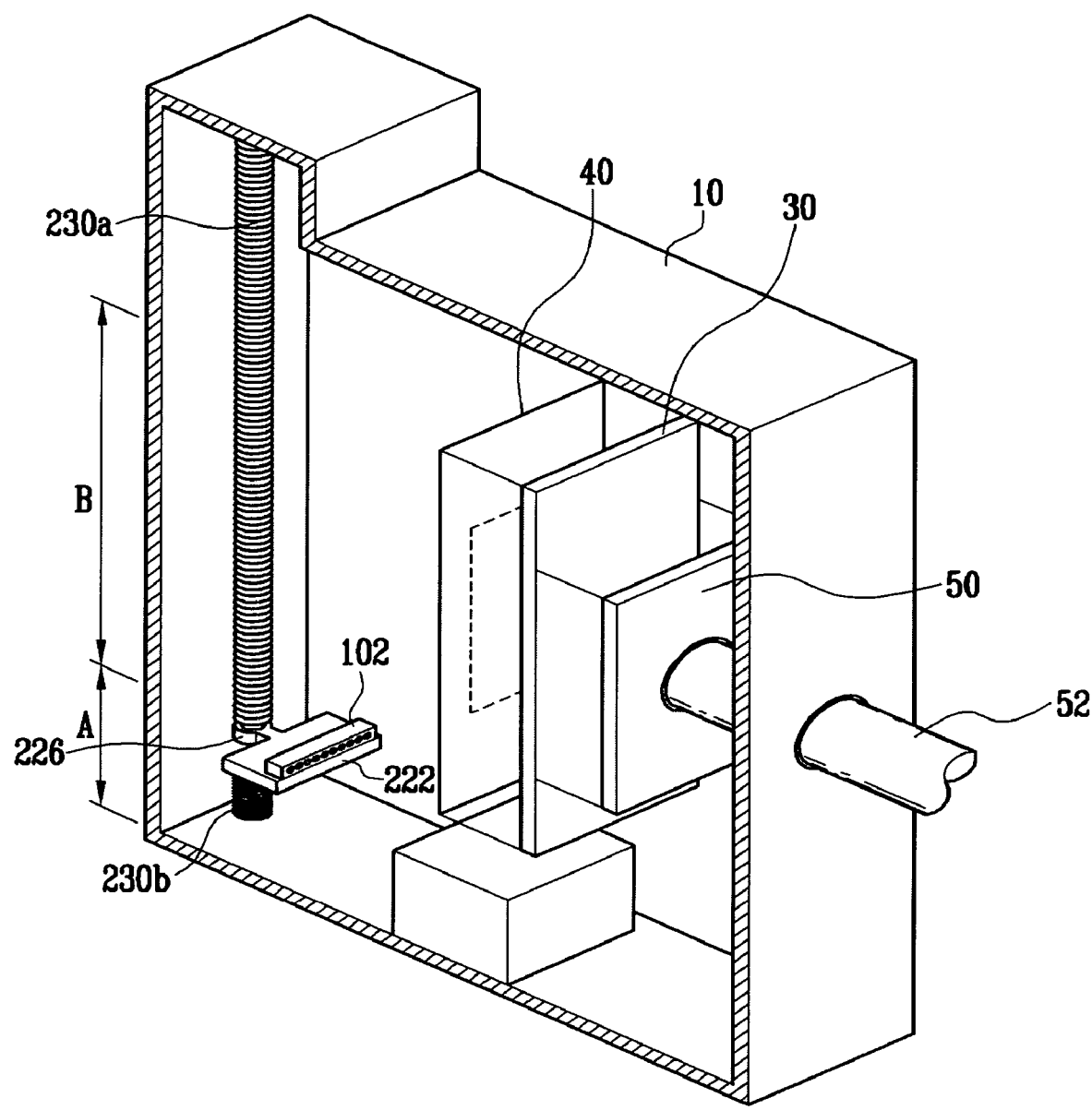
FIG. 13A is a perspective view of a vacuum deposition system illustrating a sealing apparatus with an effusion cell disposed in a buffer region.

FIG. 13A shows a deposition system provided with a sealing apparatus of a driving shaft according to another embodiment of the present invention. A chuck 50 for supporting a substrate 30 aligned with a mask 40 may be provided at one side of a vacuum chamber 10. A driving shaft 114 may be arranged at the other side of the vacuum chamber 10. The driving shaft 114 may be coupled with a shelf 112 by a coupling part 226 so that the shelf 112 may be moved up and down. An effusion apparatus 102 may be mounted on the support plate 222 of the shelf 112. An upper portion of the driving shaft 114 positioned above the coupling part 226 may be encircled by a first tube 230a and a lower portion of the driving shaft 114 positioned below the coupling part 226 may be encircled by a second tube 230b.

When the shelf 112 is positioned at a buffer region A of the vacuum chamber 10, the first tube 230a may be extended to a maximum length, and the second tube 230b may be compressed to a minimum length. The effusion apparatus 102 may be preheated in the buffer region A to vaporize an organic material until the deposition rate of the organic vapor material reaches a target value.

Figure 13B:
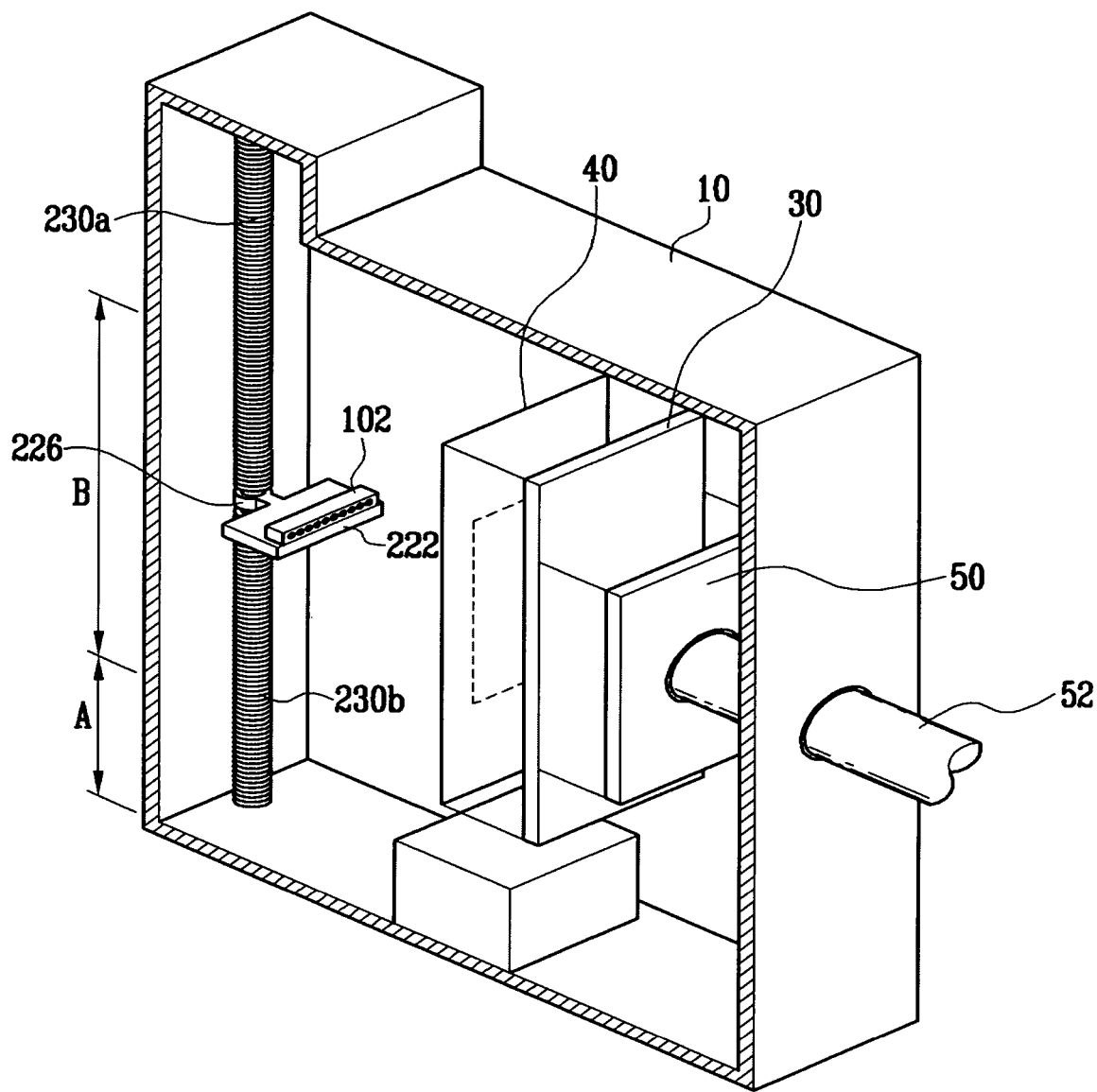
FIG. 13B is a perspective view of a vacuum deposition system illustrating a sealing apparatus with an effusion cell disposed in a film formation region.

As shown in FIG. 13b, when the deposition rate of the organic vapor material effused from the effusion cell 20 reaches the target value, the driving shaft 114 is axially rotated by a driving means (not shown), so that the shelf 112 is moved to a film formation region B of the vacuum chamber 10. The effusion apparatus then effuses the organic vapor material to form an organic layer on the substrate arranged in the vacuum chamber 10.

When the shelf 112 is positioned at the film formation region B, the first tube 230a may be slightly contracted and the second tube 230b may be slightly extended.

The driving shaft 114 is thus sealed from the atmosphere of the vacuum chamber 10 by the first tube 230a and the second tube 230b and the coupling part 226. Therefore, the organic vapor material effused from the effusion apparatus may be prevented from adhering to the driving shaft 114.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A sealing apparatus for a driving shaft of a deposition system, comprising:
   a shelf comprising,
      a coupling part adapted to be coupled with a driving shaft installed in a vacuum chamber of a deposition system, wherein the driving shaft is adapted to drive the coupling part, and
      a support plate adapted to be connected to the coupling part, to support an effusion cell that effuses an organic vapor material in the vacuum chamber;
   a first tube adapted to be arranged above the coupling part and encircle the driving shaft; and
   a second tube adapted to be arranged below the coupling part and encircle the driving shaft,
   wherein a lower end of the first tube is fixed to an upper surface of the coupling part, and
   wherein an upper end of the second tube is fixed to a lower surface of the coupling part.

2. The sealing apparatus of claim 1,
   wherein the first tube and the second tube may be expanded and compressed.

3. The sealing apparatus of claim 2,
   wherein the first tube and second tube comprise a bellows type structure.

4. The sealing apparatus of claim 1,
   wherein the driving shaft is adapted to drive the coupling part by an axial rotation of the driving shaft.

5. A deposition system comprising:
   a vacuum chamber;
   a chuck to support a substrate aligned with a mask arranged at one side of the vacuum chamber;
   a driving shaft arranged at the other side of the vacuum chamber;
   a shelf comprising,
      a coupling part coupled with the driving shaft, wherein the driving shaft is adapted to drive the coupling part, and
      a support plate connected to the coupling part;
   an effusion cell arranged on the support plate, the effusion cell to effuse an organic vapor material toward the substrate;
   a first tube encircling the driving shaft, the first tube arranged above the coupling part; and
   a second tube encircling the driving shaft, the second tube arranged below the coupling part,
   wherein a lower end of the first tube is fixed to an upper surface of the coupling part, and
   wherein an upper end of the second tube is fixed to a lower surface of the coupling part.

6. The sealing apparatus of claim 5,
   wherein the first tube and the second tube may be expanded and compressed.

7. The sealing apparatus of claim 6,
   wherein the first tube and the second tube comprise a bellows type structure.

8. The sealing apparatus of claim 5,
   wherein the driving shaft is adapted to drive the coupling part by an axial rotation of the driving shaft.

* * * * *

UNITED STATES PATENT AND TRADEMARK OFFICE
CERTIFICATE OF CORRECTION

| | | Page 1 of 1 |
|---|---|---|
| PATENT NO. | : 8,366,832 B2 | |
| APPLICATION NO. | : 11/324346 | |
| DATED | : February 5, 2013 | |
| INVENTOR(S) | : Jung et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1828 days.

Signed and Sealed this
Eleventh Day of November, 2014

Michelle K. Lee
*Deputy Director of the United States Patent and Trademark Office*